(12) United States Patent
Schulze et al.

(10) Patent No.: US 10,396,170 B2
(45) Date of Patent: Aug. 27, 2019

(54) SEMICONDUCTOR DEVICES AND METHODS FOR FORMING SEMICONDUCTOR DEVICES

(71) Applicant: Infineon Technologies AG, Neubiberg (DE)

(72) Inventors: Hans-Joachim Schulze, Taufkirchen (DE); Guenther Ruhl, Regensburg (DE); Roland Rupp, Lauf (DE)

(73) Assignee: Infineon Technologies AG (DE)

( * ) Notice: Subject to any disclaimer, the term of this patent is extended or adjusted under 35 U.S.C. 154(b) by 17 days.

(21) Appl. No.: 15/848,614

(22) Filed: Dec. 20, 2017

(65) Prior Publication Data

US 2018/0175153 A1  Jun. 21, 2018

(30) Foreign Application Priority Data

Dec. 20, 2016  (DE) .................... 10 2016 124 973

(51) Int. Cl.
| | |
|---|---|
| *H01L 29/16* | (2006.01) |
| *H01L 29/417* | (2006.01) |
| *H01L 29/45* | (2006.01) |
| *H01L 29/66* | (2006.01) |

(Continued)

(52) U.S. Cl.
CPC ......... *H01L 29/456* (2013.01); *C01B 32/184* (2017.08); *H01L 29/1606* (2013.01); *H01L 29/41741* (2013.01); *H01L 29/66712* (2013.01); *H01L 29/66734* (2013.01);

(Continued)

(58) Field of Classification Search
CPC ......... H01L 21/02378; H01L 21/02395; H01L 21/0485; H01L 29/45; H01L 29/46; H01L 29/452; H01L 29/41741; H01L 29/66712; H01L 29/66734; H01L 29/7802; H01L 29/7813; C01B 32/182–32/198; C01B 2204/00–2204/32
See application file for complete search history.

(56) References Cited

U.S. PATENT DOCUMENTS 5,742,076 A * 4/1998 Sridevan ............... H01L 21/049
257/77
6,133,587 A * 10/2000 Takeuchi ............ H01L 29/1608
257/77
(Continued)

FOREIGN PATENT DOCUMENTS

DE  10 2012 103 180 A1  10/2012

OTHER PUBLICATIONS

Byun, Kyung-Eun, et al., "Graphene for True Ohmic Contact at Metal-Semiconductor Junctions", ACS Publications: Nano Letters; 13(9), pp. 4001-4005; Aug. 26, 2013.
(Continued)

*Primary Examiner* — Zandra V Smith
*Assistant Examiner* — Jeremy J Joy
(74) *Attorney, Agent, or Firm* — Design IP

(57) ABSTRACT

A semiconductor device includes a transistor doping region of a vertical transistor structure arranged in a semiconductor substrate. Additionally, the semiconductor device includes a graphene layer portion located adjacent to at least a portion of the transistor doping region at a surface of the semiconductor substrate. The semiconductor device further includes a transistor wiring structure located adjacent to the graphene layer portion.

18 Claims, 3 Drawing Sheets

(51) Int. Cl.
*H01L 29/78* (2006.01)
*C01B 32/184* (2017.01)

(52) U.S. Cl.
CPC ...... *H01L 29/7802* (2013.01); *H01L 29/7813* (2013.01); *C01B 2204/04* (2013.01)

(56) References Cited

U.S. PATENT DOCUMENTS

| | | | | |
|---|---|---|---|---|
| 8,492,753 B2* | 7/2013 | Yager | ................ | C23C 16/0281 257/40 |
| 8,598,634 B1* | 12/2013 | Zhu | ................ | B82Y 10/00 257/209 |
| 8,912,530 B2 | 12/2014 | Yang et al. | | |
| 9,882,008 B2* | 1/2018 | Colombo | ................ | H01L 29/401 |
| 2006/0192256 A1* | 8/2006 | Cooper | ................ | H01L 29/0696 257/401 |
| 2010/0051960 A1* | 3/2010 | Chen | ................ | H01L 29/1606 257/76 |
| 2010/0055388 A1* | 3/2010 | Chen | ................ | H01L 29/1606 428/119 |
| 2010/0224851 A1* | 9/2010 | Colombo | ................ | H01L 21/02527 257/9 |
| 2011/0042687 A1* | 2/2011 | Chu | ................ | B82Y 30/00 257/77 |
| 2011/0114919 A1* | 5/2011 | Jenkins | ................ | H01L 29/78684 257/29 |
| 2012/0068157 A1* | 3/2012 | Kub | ................ | B82Y 10/00 257/15 |
| 2012/0074387 A1* | 3/2012 | King | ................ | H01L 21/02381 257/29 |
| 2012/0228631 A1* | 9/2012 | Kono | ................ | H01L 29/4966 257/77 |
| 2012/0261673 A1 | 10/2012 | Schulze et al. | | |
| 2012/0267041 A1* | 10/2012 | Woo | ................ | B32B 37/02 156/230 |
| 2013/0075700 A1* | 3/2013 | Yang | ................ | H01L 29/45 257/27 |
| 2013/0087446 A1* | 4/2013 | Zhamu | ................ | B82Y 40/00 204/157.43 |
| 2014/0110662 A1* | 4/2014 | Duan | ................ | H01L 29/1606 257/12 |
| 2014/0120270 A1* | 5/2014 | Tour | ................ | C23C 16/26 427/596 |
| 2014/0141600 A1* | 5/2014 | Lee | ................ | H01L 21/0242 438/479 |
| 2014/0158989 A1* | 6/2014 | Byun | ................ | H01L 29/452 257/29 |
| 2014/0175458 A1* | 6/2014 | Ahn | ................ | H01L 21/02378 257/77 |
| 2014/0361250 A1* | 12/2014 | de Heer | ................ | H01L 29/66431 257/27 |
| 2017/0025508 A1* | 1/2017 | Lee | ................ | H01L 29/417 |
| 2017/0260651 A1* | 9/2017 | Robinson | ................ | C30B 25/183 |

OTHER PUBLICATIONS

He, Ze-Zheo, et al., "Improvement of Metal-Graphene Ohmic Contact Resistance in Bilayer Epitaxial Graphene Devices"; Chinese Physical Society and IOP Publishing Ltd.; Chinese Physics Letters, vol. 32, No. 11, pp. 117204-1 to 117204-4; Nov. 2015.

Nagashio, K., et al., "Intrinsic Graphene/Metal Contact", Electron Devices Meeting (IEDM), 2012 IEEE International, 4.1.1-4.1.4, Dec. 10-13, 2012.

Leong, Wei Sun, et al., "Low-Countact-Resistance Graphene Devices with Nickel-Etched-Graphene Contacts", ACS Publications: Nano Letters; 8 (1), pp. 994-1001; Dec. 14, 2013.

Hertel, S., et al., "Tailoring the graphene/silicon carbide interface for monolithic wafer-scale electronics", Nature Communications, 3:957, Macmilian Publishers Limited, DOI: 10.1038/ncomms1955, Jul. 17, 2012.

* cited by examiner

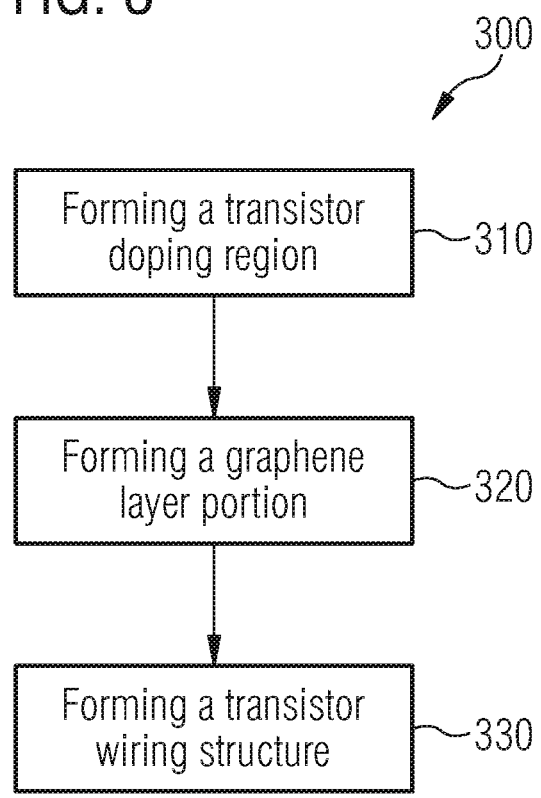

SEMICONDUCTOR DEVICES AND METHODS FOR FORMING SEMICONDUCTOR DEVICES

FIELD

Embodiments relate to concepts for increasing a robustness of semiconductor devices and in particular to semiconductor devices and methods for forming semiconductor devices.

BACKGROUND

Semiconductor devices (e.g., power devices) may have to be optimized with respect to low contact resistance. Nevertheless, it is desired to form semiconductor devices with high robustness, e.g., with high latch-up strength.

SUMMARY

There may be a demand to provide concepts for semiconductor devices with improved robustness.

Such a demand may be satisfied by the subject matter of the claims.

Some embodiments relate to a semiconductor device. The semiconductor device includes a transistor doping region of a vertical transistor structure arranged in a semiconductor substrate. Additionally, the semiconductor device includes a graphene layer portion located adjacent to at least a portion of the transistor doping region at a surface of the semiconductor substrate. The semiconductor device further includes a transistor wiring structure located adjacent to the graphene layer portion.

Some embodiments relate to a method for forming a semiconductor device. The method includes forming a transistor doping region of a vertical transistor structure in a semiconductor substrate. Additionally, the method includes forming a graphene layer portion located adjacent to at least a portion of the transistor doping region at a surface of the semiconductor substrate. The method further includes forming a transistor wiring structure located adjacent to the graphene layer portion.

BRIEF DESCRIPTION OF THE DRAWINGS

Some examples of apparatuses and/or methods will be described in the following by way of example only, and with reference to the accompanying figures, in which

FIG. 3 shows a flow chart of a method for forming a semiconductor device.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than two elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
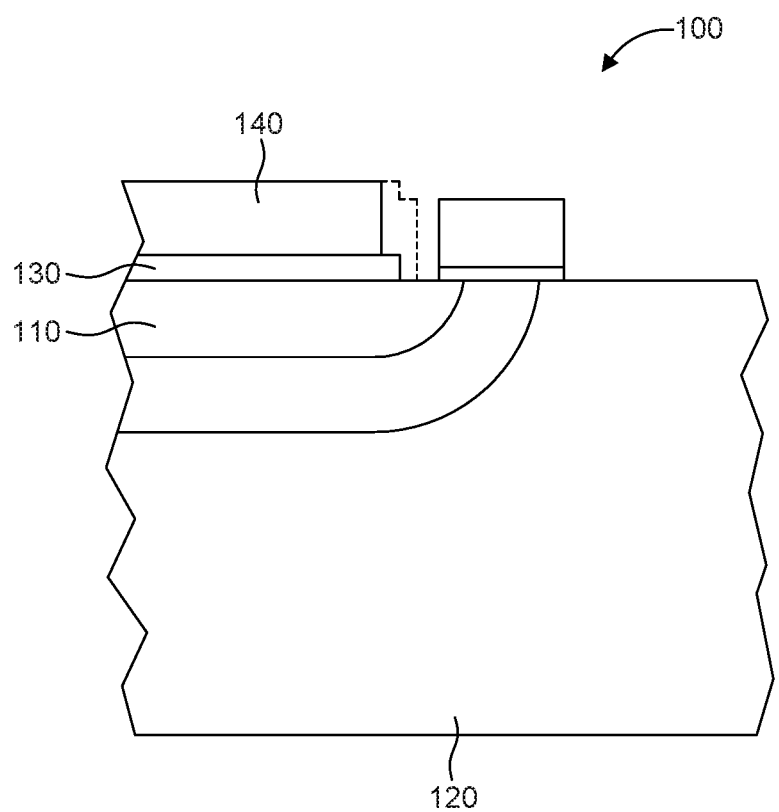
FIG. 1 shows a schematic cross section of a part of a semiconductor device.

FIG. 1 shows a schematic cross section of a part of a semiconductor device 100. The semiconductor device 100 comprises a transistor doping region 110 of a vertical transistor structure arranged in a semiconductor substrate 120. Additionally, the semiconductor device 100 comprises a graphene layer portion 130 located adjacent to at least a portion of the transistor doping region 110 at a surface of the semiconductor substrate 120. The semiconductor device 100 further comprises a transistor wiring structure 140 located adjacent to the graphene layer portion 130.

By arranging the graphene layer portion 130 between the portion of the transistor doping region 110 and the transistor wiring structure 140 an ohmic contact may be formed between the portion of the transistor doping region 110 and the transistor wiring structure 140 independent from a doping concentration of the transistor doping region 110. In this way, a low contact resistance may be achieved. Due to the low and ohmic contact resistance an average doping concentration of the transistor doping region 110 may be reduced without the risk of providing a Schottky contact. In this way, an emitter efficiency of a contact between the transistor doping region 110 (e.g., a source region or an emitter region) and an adjacent body doping region may be reduced. By this, a latch-up strength of the semiconductor device 100 may be increased. Thus, an overcurrent cut-off capability as well as a cosmic radiation strength of the semiconductor device may be improved. In this way, a robustness of the semiconductor device 100 may be enhanced. Further, an additional contact implantation to improve the ohmic contact close to the surface of the semiconductor substrate 120 may be avoided. In this way, manufacturing costs for forming the semiconductor device 100 may be reduced.

For example, the surface of the semiconductor substrate 120 may be a front side surface or a back side surface of the semiconductor substrate 120. For example, the graphene layer portion 130 may cover at least 25% (e.g., at least 50%, at least 75%, or at least 90%) of the transistor doping region 110 at the surface of the semiconductor substrate 120. For example, the transistor wiring structure 140 may form an electrical connection from the transistor doping region 110 to a contact interface (e.g., a pad) for connecting an external control circuit. For example, a portion of the transistor wiring structure 140 may form a front side metallization or a back side metallization.

For example, the transistor wiring structure 140 may comprise an electrically conductive layer (e.g., a barrier layer and/or a metal layer) located adjacent to the graphene layer portion 130. By arranging the graphene layer portion 130 between the portion of the transistor doping region 110 and the transistor wiring structure 140 a generation of a Schottky barrier between the portion of the transistor doping region 110 and the transistor wiring structure 140 may be avoided. For example, the electrically conductive layer may comprise aluminum, titanium, an alloy of titanium and tungsten, titanium nitride, tantalum, tantalum nitride, tungsten, and/or a combination thereof. Additionally or optionally, a power metallization may be deposited on the electrically conductive layer. For example, the power metallization may comprise a thick copper layer, nickel, chromium, and/or a silicide (e.g., nickel silicide or platinum silicide). For example, the electrically conductive layer may comprise a metal that does not form any, or only instable, carbides with graphene below 1000° C. such as aluminum, copper, gold and/or nickel and/or an alloy of aluminum, copper, gold and/or nickel.

Optionally or additionally, the transistor wiring structure 140 may comprise a barrier layer located adjacent to the graphene layer portion 130. The electrically conductive layer may be located adjacent to the barrier layer and may form a metallization. In this way, a diffusion of metal atoms from the transistor wiring structure 140 (e.g., from the electrically conductive layer) into the graphene layer portion 130 and/or the transistor doping region 110 may be avoided. For example, the barrier layer may comprise titanium and/or titanium nitride. Furthermore, for several metals the graphene layer portion 130 may act as barrier layer itself.

For example, the transistor doping region 110 may be a source (or a drain) doping region or an emitter (or a collector) doping region of the vertical transistor structure.

For example, an average doping concentration of the transistor doping region 110 may be greater than 80% (or greater than 90%, greater than 100%, or greater than 130%) of an average doping concentration of a body doping region of the vertical transistor structure arranged adjacent to the transistor doping region 110 in the semiconductor substrate 120 and less than 1000% (or less than 500%, less than 350%, less than 250%, less than 180%, or less than 150%) of the average doping concentration of the body doping region of the vertical transistor structure. An average doping concentration of a region may be a number of net dopant atoms per volume averaged over the region, for example. For example, the number of net dopant atoms in a region may be a number of dopant atoms of a first conductivity type in the region minus a number of dopant atoms of a second conductivity type in the region.

For example, the transistor doping region 110 may be a source doping region having a first conductivity type. The body doping region may have a second conductivity type. For example, an emitter efficiency of a junction of the source doping region and the body doping region may be reduced. By this, a dose of a redundancy implantation of dopant atoms of the second conductivity type in the body doping region (e.g., a p+ doping of the body doping region) may be significantly reduced. The redundancy implantation may be entirely omitted in case of a sufficiently low doping concentration of the source doping region (e.g., in case a source implantation dose is lowered sufficiently).

For example, an average doping concentration of the transistor doping region 110 may be less than $5*10^{18}$ (e.g., less than $1*10^{18}$, less than $5*10^{17}$, or less than $1*10^{17}$) dopant atoms per $cm^3$. In this way, an emitter efficiency of a junction between the transistor doping region 110 and the second transistor doping region may be further reduced.

For example, an average doping concentration of a portion of the transistor doping region 110 located in proximity to the graphene layer portion 130 (e.g., at a vertical distance of less than 5 µm, less than 1 µm, or less than 300 nm to the graphene layer portion 130) may be less than $5*10^{18}$ (or less than $1*10^{18}$, less than $5*10^{17}$, or less than $1*10^{17}$) dopant atoms per $cm^3$.

For example, the graphene layer portion 130 may be a portion of a graphene monolayer or of graphene multilayers. For example, the graphene layer portion 130 may comprise more than one (e.g., more than 2, more than 5, or more than 10) atomic layers of graphene.

For example, the semiconductor device 100 may comprise a plurality of graphene layer portions 130. Each of the graphene layer portions 130 may be located adjacent to a respective portion of the transistor doping region 110 at the surface of the semiconductor substrate 120.

For example, as represented by the dotted line in FIG. 1, the transistor wiring structure 140 may be broadened to directly contact the surface of the transistor doping region 110 between neighboring graphene layer portions 130. By this, an adhesion of the graphene layer portions 130 at the surface of the semiconductor substrate 120 may be improved.

For example, neighboring graphene layer portions 130 of the plurality of graphene layer portions 130 may be located at a distance of at least 1 µm (or of at least 5 µm, of at least 10 µm, or of at least 25 µm) from one another. In this way, an adhesion of the graphene layer portions 130 on the surface of the semiconductor substrate 120 may be further improved.

For example, the transistor doping region 110 may be arranged in an epitaxial semiconductor layer of the semiconductor substrate. For example, the transistor doping region 110 may be formed by incorporating dopants of the first conductivity type during a growth of the epitaxial semiconductor layer or by an implantation of dopants of the first conductivity type after the growth of the epitaxial semiconductor layer.

For example, the semiconductor substrate 120 may be a silicon carbide based semiconductor substrate. In this way, the graphene layer portion 130 may be efficiently formed by tempering of the silicon carbide based semiconductor substrate. Alternatively, the semiconductor substrate 120 may be a silicon substrate or a gallium arsenide (GaAs)-based semiconductor substrate. For example, the semiconductor substrate 120 may be a semiconductor wafer or a semiconductor die.

For example, a region having the first conductivity type may be an n-doped region (e.g., caused by incorporating nitrogen ions, phosphor ions or arsenic ions) or a p-doped region (e.g., caused by incorporating aluminum ions or boron ions). Consequently, the second conductivity type indicates an opposite p-doped region or n-doped region. In other words, the first conductivity type may indicate a p-doping and the second conductivity type may indicate an n-doping or vice-versa.

For example, the transistor doping region 110 may have the first conductivity type (e.g., n-doped or p-doped). The vertical transistor structure may include a source/drain or collector/emitter region formed by the transistor doping region 110, a body region having a second conductivity type (e.g., p-doped or n-doped) and a drift region having the first conductivity type, for example. The source/drain or collector/emitter region of the vertical transistor structure, the body region of the vertical transistor structure and the drift region of the vertical transistor structure may be located adjacent to a trench containing a gate (or gate electrode), for example. The gate may control a conductive channel through the body region. A gate voltage applied to the gate (or gate electrode) may control the conductive channel (e.g., an n-channel or a p-channel) in the body region of the vertical transistor structure between the source/drain or collector/emitter region of the vertical transistor structure and the drift region of the vertical transistor structure. The conductive channel may be formed in a part of the body region of the vertical transistor structure adjacent to the gate (or gate electrode), and a current flow may occur between the source/drain or collector/emitter region of the vertical transistor structure and the drift region of the vertical transistor structure through the controlled conductive channel, for example.

For example, the vertical transistor structure may be a vertical field effect transistor (FET) (e.g., a lateral gate FET, a trench gate FET, a metal-oxide-semiconductor field-effect transistor (MOSFET), or a vertical junction gate field-effect transistor (JFET)) or a vertical insulated-gate bipolar transistor (IGBT) (e.g., a lateral gate IGBT, or a trench gate IGBT). For example, the semiconductor device 100 illustrated in FIG. 1 may be a lateral gate FET. In case the vertical transistor structure being a vertical FET, the transistor doping region 110 may be source region or a drain region of the vertical FET. In case the vertical transistor structure being a vertical IGBT, the transistor doping region 110 may be a source region (or an emitter region) of the vertical IGBT. The vertical transistor structure may be a transistor cell of a plurality of transistor cells (e.g., connected in parallel) of a vertical transistor arrangement.

In the case the vertical transistor structure being a vertical MOSFET, the drift region of the vertical MOSFET may be located between (e.g., directly between or directly adjacently to) the body region of the vertical MOSFET and the drain region of the vertical MOSFET. The drain region of the vertical MOSFET may extend from the drift region of the vertical MOSFET to a back side surface of the semiconductor substrate 120 opposite to the front side of the semiconductor substrate 120.

In the case the vertical transistor structure being a vertical IGBT, the drift region of the vertical IGBT may be located between the body region of the vertical IGBT and a back side emitter/collector region of the vertical IGBT. The emitter/collector region of the vertical IGBT may extend from the drift region of the vertical IGBT to the back side surface of the semiconductor substrate 120.

For example, the vertical transistor structure may comprise a breakdown voltage of more than 10V. For example, the semiconductor device 100 may be a power semiconductor device. A power semiconductor device and/or the vertical transistor structure of the power semiconductor device may have a breakdown voltage or blocking voltage of more than 10V (e.g., a breakdown voltage of 10V, 20V or 50V), more than 100V (e.g., a breakdown voltage of 200 V, 300V, 400V or 500V), more than 500V (e.g., a breakdown voltage of 600V, 700V, 800V or 1000V) or more than 1000V (e.g., a breakdown voltage of 1200V, 1500V, 1700V, 2000V, 3300V or 6500V). The semiconductor device 100 may comprise a vertical transistor structure with a gate trench as described above or below. The vertical transistor structure may be may be a vertical MOSFET (Metal-Oxide-Semiconductor-Field-Effect-Transistor) or a vertical insulated-gate bipolar transistor (IGBT) comprising a plurality of transistor cells. Each transistor cell may comprise a gate trench or share a gate trench with one or more other transistor cells.

For example, a vertical direction or a vertical dimension may be measured orthogonal to the front side surface of the semiconductor substrate 120 and a lateral direction or lateral dimensions may be measured in parallel to the front side surface of the semiconductor substrate 120.

The front side or front side surface of the semiconductor substrate 120 may be the side used to implement more sophisticated and complex structures than at the back side of the semiconductor substrate 120, since the process parameters (e.g., temperature) and the handling may be limited for the back side, if structures are already formed at one side of the semiconductor substrate 120, for example.

Figure 2:
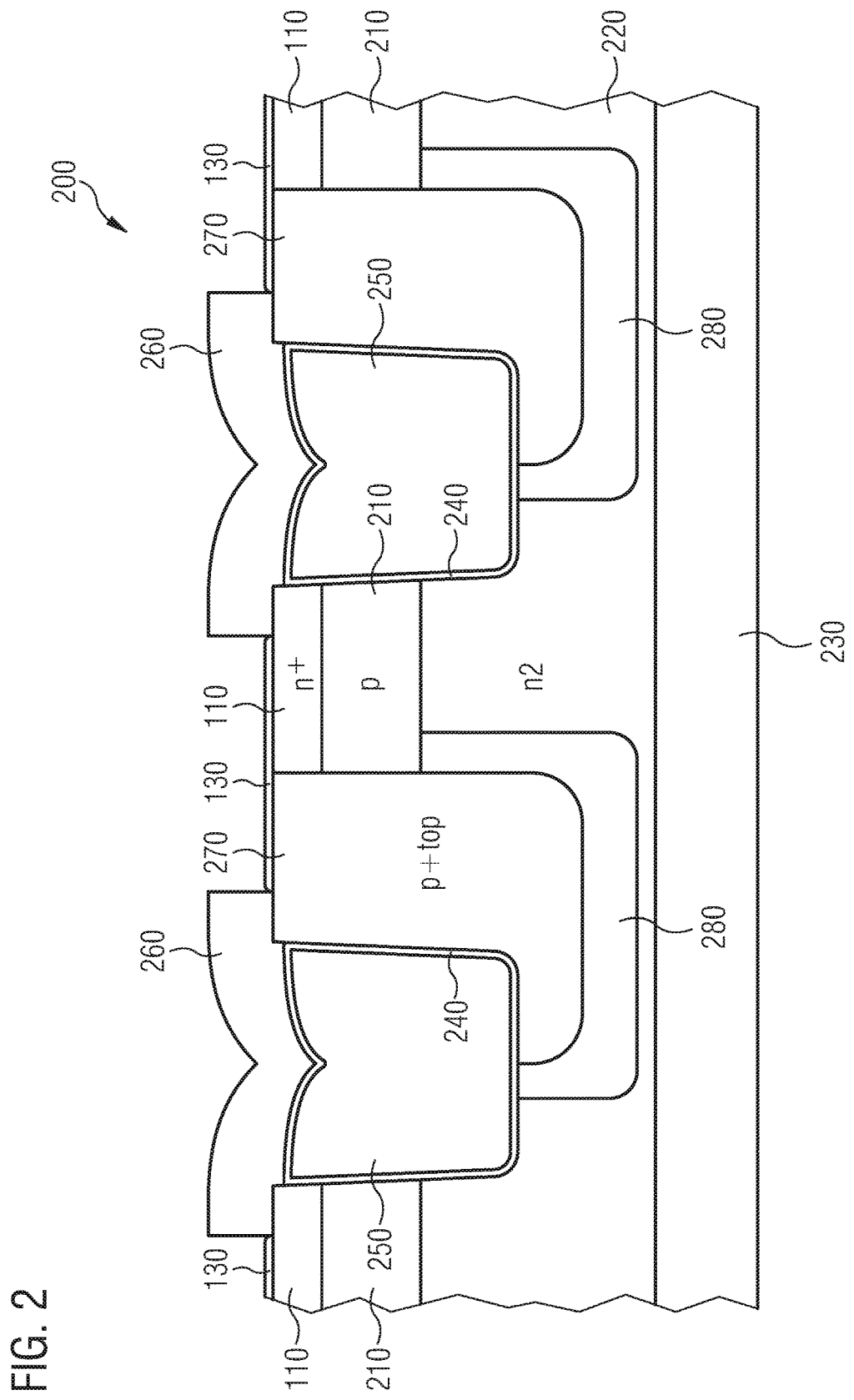
FIG. 2 shows a schematic cross section of a part of another semiconductor device.

FIG. 2 shows a schematic cross section of a part of another semiconductor device 200. The implementation of the semiconductor device 200 may be similar to the implementation of the semiconductor device described in connection with FIG. 1. The semiconductor device 200 comprises three transistor doping regions 110, which each form a source doping region (e.g., an n+ doped source region) of a vertical transistor structure. The vertical transistor structure may be a vertical MOSFET structure. Further, the semiconductor device 200 comprises three body doping regions 210 (e.g., p-doped) of the vertical transistor structure. Additionally, the semiconductor device 200 comprises a common drift region 220 (e.g., an n2 region) of the vertical transistor structure, a drain region 230 of the vertical transistor structure, and two gate trenches 240 of the vertical transistor structure. In each of the gate trenches 240 a gate electrode 250 is arranged. The gate electrodes 250 may each be electrically isolated from the semiconductor substrate by an insulating layer. Further, a respective contact element 260 (e.g., a metallization layer) is located adjacent to each of the gate electrodes 250. For example, the respective contact element 260 (e.g., a gate metallization) may be electrically insulated from a metallization of the transistor doping regions 110 (e.g., from a source metallization). The contact elements 260 and the metallization of the transistor doping regions 110 may be separate elements of a wiring structure for contacting the vertical transistor structure of the semiconductor device 200, for example. The semiconductor device 200 further comprises two second transistor doping regions 270 (e.g., p+top regions), by which the body doping region 210 may be electrically contacted from a front side surface of a semiconductor substrate of the semiconductor device 200. For example, the transistor doping regions 110 and the second transistor doping regions 270 may be short-circuited. The second transistor doping regions 270 are each located adjacent to one of the gate trenches 240 and one of the body regions 210. Additionally, the semiconductor device 200 comprises two shielding regions 280 (e.g., p-doped). The shielding regions 280 are each located between one of the second transistor doping regions 270 and the common drift region 220. Additionally, three graphene layer portions 130 are each located adjacent to a portion of one of the transistor doping regions 110 and to a portion of one of the second transistor doping regions 270 at the surface of the semiconductor substrate of the semiconductor device 200. Further, each of the contact elements 260 is located adjacent to a further portion of one of the transistor doping regions 110 and to a further portion of one of the second transistor doping regions 270 at the surface of the semiconductor substrate of the semiconductor device 200. For example, the semiconductor device 200 may be a trench gate MOSFET.

FIG. 2 shows an example of an implementation of a graphene contact layer (e.g., of the graphene layer portion 130) in a silicon carbide (SiC) trench MOSFET. FIG. 2 may show the semiconductor device 200 after an intermediate manufacturing step. In a later manufacturing step, the graphene layer portions 130 may be removed from the portions of the second transistor doping regions 270. Alternatively, the graphene layer portions 130 may remain at the portions of the second transistor doping regions 270. For example, each of the graphene layer portions 130 may cover less than 50% (e.g., less than 40%, less than 20%, or less than 10%) of a lateral area of a respective second transistor doping region 270 at the front side surface of the semiconductor substrate.

For example, the transistor doping region 110 may be a source zone (e.g., a source region). A relatively low doping of the source zone, e.g., using, nitrogen atoms, may be carried out. The doping may be low enough to result in a lowest possible emitter efficiency of the source/body junction (e.g., an n-source/p-body junction).

For example, the transistor doping region 110 may be a lightly doped source zone (e.g., a lightly doped source region) and the transistor wiring structure 140 may be a source metallization. To enable an ohmic contact between this lightly doped source zone and the source metallization, the graphene layer portion 130 may be generated locally in an area of the source zone surface prior to a deposition of the source metallization. The graphene layer portion 130 may enable a formation of ohmic source-zone contacts at n-dopings (e.g., of the source zone) which are below $1*10^{17}$ donor atoms per $cm^3$.

For example, the transistor doping region 110 may be a source zone (e.g., a source region). An electrically active, effective doping concentration of the source zone or of atoms used for the source-zone doping (e.g., nitrogen doping atoms) may be in the range of a doping concentration of the body doping region (e.g., in the range of an adjacent body doping). For example, the doping concentration of the source zone may be slightly lower, about the same, or not higher than a factor of 5 of the doping concentration of the body doping region. For example, the doping concentration of the source zone may be less than 1000% higher or less than 30% higher than the doping concentration of the body doping region. In this way, an emitter efficiency of the source zone may be relative low. Additionally, a voltage drop occurring in the source zone in a conducting state or during switching of the device (e.g., of the vertical transistor structure) may be significantly lower than a voltage drop in the drift region 220 (e.g., in a drift zone) but on the other hand higher than the voltage drop for a highly doped source zone. Due to this low additional voltage drop, which occurs in the source zone in case of a current flow, a significant reduction in a filamentation formation in the event of an overcurrent may be entailed, as this additional voltage drop counters a tendency to filamentation.

For example, the transistor doping region 110 may be an emitter/source zone (e.g., an emitter region) of a SiC-based IGBT or a source zone (e.g., a source region) of a power MOSFET and the transistor wiring structure 140 may comprise a metallization applied thereupon. The graphene layer portion 130 may be generated between the surface of the emitter zone or of the source zone and the metallization applied thereupon. Simultaneously, a doping of the emitter zone or of the source zone (e.g., a source doping of the power MOSFET or an emitter/source doping of the IGBT) may be significantly reduced. By means of the graphene layer portion 130, an ohmic contact with low contact resistance, which contributes to the overall resistance to a very limited extent only, may be achieved despite this reduced doping.

More details and aspects are mentioned in connection with the embodiments described above or below. The embodiment shown in FIG. 2 may comprise one or more optional additional features corresponding to one or more aspects mentioned in connection with the proposed concept or one or more embodiments described above (e.g., FIG. 1) or below (e.g., FIG. 3).

FIG. 3 shows a flow chart of a method 300 for forming a semiconductor device. The method 300 comprises forming 310 a transistor doping region 110 of a vertical transistor structure in a semiconductor substrate 120. Further, the method 300 comprises forming 320 a graphene layer portion 130 located adjacent to at least a portion of the transistor doping region 110 at a surface of the semiconductor substrate 120. Additionally, the method 300 comprises forming 330 a transistor wiring structure 140 located adjacent to the graphene layer portion 130.

In this way, a semiconductor device having an ohmic contact between the portion of the transistor doping region 110 and the transistor wiring structure 140 may be formed. By this, a semiconductor device with a low contact resistance may be formed. Due to the low contact resistance an average doping concentration of the transistor doping region 110 may be reduced. In this way, an emitter efficiency of a contact between the transistor doping region 110 and an adjacent further transistor doping region may be reduced. By this, a semiconductor device having increased latch-up strength may be formed. Thus, a semiconductor device having an improved overcurrent turn-off capability as well as improved cosmic radiation strength may be formed. In this way, a semiconductor device with an enhanced robustness may be formed. Further, an additional contact implantation to improve the ohmic contact close to the surface of the semiconductor substrate 120 may be avoided. In this way, the semiconductor device may be formed more cost efficiently.

For example, forming 330 of the transistor wiring structure 140 may be performed at least by parts before forming 320 of the graphene layer portion 130. Alternatively, forming 320 of the graphene layer portion 130 may be performed at least by parts before forming 330 of the transistor wiring structure 140.

For example, forming 310 of the transistor doping region 110 may comprise growing an epitaxial semiconductor layer on the semiconductor substrate 120. Additionally, forming 310 of the transistor doping region 110 may comprise incorporating dopants during a growth of the epitaxial semiconductor layer or implanting dopants after the growth of the epitaxial semiconductor layer applying a subsequent annealing step. Alternatively, forming 310 of the transistor doping region 110 may comprise forming and patterning a photolithography mask in a lithographic process to form a selected region of the semiconductor substrate 120. Additionally, forming 310 of the transistor doping region 110 may comprise implanting doping atoms in the selected region of the semiconductor substrate 120 to form the transistor doping region 110.

For example, forming 330 of the transistor wiring structure 140 may comprise forming a metallization layer located adjacent to the graphene layer portion 130. In this way, the transistor doping region 110 may be efficiently electrically contacted. Alternatively, forming 330 of the transistor wiring structure 140 may comprise forming a barrier layer located adjacent to the graphene layer portion 130 and forming a metallization layer located adjacent to the barrier layer.

For example, the semiconductor substrate 120 may be a silicon carbide (SiC) based semiconductor substrate. The silicon carbide based semiconductor substrate may be tempered to form the graphene layer portion 130 at the surface of the silicon carbide based semiconductor substrate. By this, a process effort for forming the graphene layer portion 130 may be reduced. For example, the silicon carbide based semiconductor substrate may be tempered at an oven temperature in the range of 950° C. to 1600° C. (e.g., in the range of 1000° C. to 1400° C. or in the range of 1100° C. to 1300° C.).

For example, the graphene layer portion 130 may be generated by a suitable tempering of the SiC substrate (e.g., a SiC based semiconductor substrate) with an oven temperature between 950° C. and 1600° C. The oven temperature may be selected depending on process conditions. Alternatively, the graphene layer portion 130 may be deposited on the surface of the semiconductor substrate 120 (e.g., a disk surface) using other methods.

For example, the graphene layer portion 130 may be formed (by tempering of the silicon carbide based semiconductor substrate) before forming of a gate oxide of the vertical transistor structure.

For example, the graphene layer portion 130 may be formed at a silicon terminated side of the silicon carbide based semiconductor substrate. For example, the graphene layer portion 130 may be grown on a silicon terminated side of the silicon carbide based semiconductor substrate. For example, the graphene layer portion 130 may be formed as a graphene monolayer (e.g., a single-layered graphene layer).

For example, the method 300 may further comprise removing a portion of the graphene layer portion 130 located laterally outside of (the portion of) the transistor doping region 110. By this, an electrical contacting of a body region of the vertical transistor structure by the graphene layer portion 130 may be avoided.

For example, removing of the portion of the graphene layer portion 130 or structuring of the graphene layer portion 130 may comprise coating of the graphene layer portion 130 with a photoresist, exposure of the coated graphene layer portion 130 (e.g., using ultraviolet radiation), and etching of the exposed graphene layer portion 130 in oxygen ($O_2$) plasma. The remaining photoresist may be selectively striped from the graphene layer portion 130 using a solvent (e.g., acetone).

Alternatively, removing of the portion of the graphene layer portion 130 or structuring of the graphene layer portion 130 may comprise coating of the graphene layer portion 130 with a hard mask. For example, a capping layer may be formed by the hard mask. The hard mask or capping layer may comprise aluminum oxide ($Al_2O_3$), for example. The hard mask or capping layer may be formed using a preserving atomic layer deposition (ALD) process. Additionally, the hard mask or capping layer and/or the graphene layer portion 130 may be structured. The hard mask or capping layer may be etched using a plasma process (e.g., chlorine ($Cl_2$) plasma) with a stop on the SiC bases semiconductor substrate, since the graphene (e.g., from the graphene layer portion 130) may be removed as well. Alternatively, the hard mask or capping layer may be wet-etched. For example, the hard mask or capping layer may be very thin, and thus an anisotropic effect of the etching may be less significant. Further, the exposed graphene (e.g., of the graphene layer portion 130) may be etched in $O_2$ plasma. Additionally, the hard mask or capping layer may be selectively wet-etched (e.g., using hydrogen fluoride (HF) or hydrofluoric acid).

For example, the method 300 may further comprise forming a carbonaceous metal layer at the surface of the semiconductor substrate 120. Additionally, the method 300 may comprise segregating carbon atoms from the carbonaceous metal layer at an interface between the semiconductor substrate 120 and the carbonaceous metal layer to form the graphene layer portion 130 between the semiconductor substrate 120 and the carbonaceous metal layer. In this way, the graphene layer portion 130 may be efficiently formed on the semiconductor substrate 120. For example, the semiconductor substrate 120 may be a silicon based semiconductor substrate, a silicon carbide (SiC) based semiconductor substrate, or a gallium arsenide (GaAs)-based semiconductor substrate. For example, the carbonaceous metal layer may be a carbonaceous nickel (Ni) or nickel copper (Ni/Cu) layer. For example, the carbon atoms may be segregated from the carbonaceous metal layer at a temperature in the range of 700° C. to 1000° C. (e.g., in the range of 800° C. to 900° C.).

For example, a structured deposition of the graphene layer portion 130 via a segregation method at approximately 700° C. to 1000° C. from a carbonaceous Ni or Ni/Cu layer may be performed. Further, the Ni or Ni/Cu layer may be removed using wet etching. The carbonaceous Ni or Ni/Cu layer may already be structured prior to performing the segregation step so that the graphene layer portion 130 may already be deposited in a structured form. Also a local laser anneal of the carbonaceous Ni or Ni/Cu layer may be applied to only locally perform the segregation process generating a patterned graphene layer portion 130 or a patterned graphene layer. Alternatively, the Ni or Ni/Cu layer may remain on the graphene layer portion 130 and serve as a contact metal (e.g., as the transistor wiring structure 140).

For example, the carbonaceous metal layer may form at least a portion of the transistor wiring structure 140. In this way, a cost intensive depositing of a metal layer to form the transistor wiring structure 140 may be omitted. For example, the portion of the transistor wiring structure 140 may be a metallization layer located adjacent to the graphene layer portion 130.

Alternatively, the method 300 may further comprise removing the carbonaceous metal layer from the graphene layer portion 130 after segregating of the carbon atoms from the carbonaceous metal layer and before forming 330 of the transistor wiring structure 140. In this way, the transistor wiring structure 140 may be formed from a different metal than the metal of the carbonaceous metal layer.

For example, the method 300 may further comprise removing a portion of the carbonaceous metal layer located laterally outside of the portion of the transistor doping region 130 before segregating of the carbon atoms from the carbonaceous metal layer. By this, an electrical contacting of a further transistor region (e.g., of a body doping region) by the graphene layer portion 130 may be avoided.

For example, the graphene layer portion 130 may be formed (by segregating of the carbon atoms from the carbonaceous metal layer) after forming of a gate oxide of the vertical transistor structure.

For example, depending on the design of the gate structure, the graphene layer portion 130 may be generated on the surface of the semiconductor substrate 120 (e.g., on a SiC disk surface) or also in a gate trench of the vertical transistor structure. For example, a contact tempering step may be omitted due to the low intrinsic barrier of graphene on SiC.

In case the semiconductor substrate 120 being a SiC based semiconductor substrate, a process effort made for generating the graphene layer portion 130 may be relatively low, for example. In case the semiconductor device being a silicon-based device, a resulting contact resistance may be reduced at a specific source zone doping, if the graphene layer portion 130 is located between a silicon surface and a metallization layer, for example.

For example, to improve an adhesion of the graphene layer portion 130 on the surface of the semiconductor substrate 120 (e.g., on a source surface), the graphene layer portion 130 may be segmented on the surface of the semiconductor substrate 120 (e.g., on source). For example, the vertical transistor structure may comprise stripe transistor cells and segments of the graphene layer portion 130 may be arranged perpendicular to the stripe transistor cells (e.g., to stripes) in order to link the good adhesion properties of titanium (Ti) or nickel (Ni) and the very good contact properties of graphene.

For example, further elements of the semiconductor device may be formed depending on the way, in which the graphene layer portion 130 is deposited on the surface of the semiconductor substrate 120 (e.g., on a source region) and on the process options which, as a consequence thereof, remain for the manufacture of a neighboring contact element (e.g., of a p-contact).

In case the graphene layer portion 130 being formed by tempering the SiC based semiconductor substrate (e.g., via a high-temperature step and an evaporation of SiC), the forming 320 of the graphene layer portion 130 may be performed prior to a forming (e.g., a manufacturing) of a gate oxide system of the vertical transistor structure. Further, a local protection of the graphene layer portion 130 in a contact area in form of a capping layer (e.g., $Al_2O_3$) may be provided during subsequent oxidation and high temperature (HT) steps. For example, a forming of a subsequent body contact (e.g., by a structured NiAl deposition and subsequent annealing) may be performed.

In case, the graphene layer portion 130 being formed by segregation from the carbonaceous metal layer (e.g., via segregation from an Ni layer), the forming 320 of the graphene layer portion 130 may be performed after forming (e.g., a manufacturing) of a gate oxide system of the vertical transistor structure. Here, a capping (e.g., of the graphene layer portion 130) may be omitted. Further, the carbonaceous metal layer (e.g., a segregation metal) may be either already deposited in a structured form or may be structured prior to the forming 320 of the graphene layer portion 130. Additionally, a p-contact of the vertical transistor structure may either be formed prior (e.g., by a structured NiAl deposition and annealing) or synchronously (e.g., NiAl, Al or another p-contact) to the forming of the graphene layer portion 130. For example, forming of the p-contact may comprise forming a structured deposition in a region of the body contact. The structured deposition may be covered by the Ni segregation layer and the contact may be formed in the segregation-tempering step.

In case the semiconductor device being a silicon device or in case the semiconductor substrate 120 being a silicon based semiconductor substrate, the graphene layer portion 130 may be formed by a segregation approach using a silicon qualified p-contact-metal.

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g., FIGS. 1-2) or below.

Some embodiments relate to a method for forming SiC based power devices with an enhanced robustness.

According to an aspect, a latch-up strength and thus an overcurrent turn-off capability as well as a cosmic radiation strength of SiC-based IGBTs and a parasitic influence of an n-source in SiC-based power MOSFETs may be improved by providing the graphene layer portion.

According to an aspect, an occurrence of Schottky junctions may be avoided by providing the graphene layer portion.

According to an aspect, the graphene layer or the transistor doping region may be detected by high-resolution doping profile measurements and/or by fabricating cross-sections.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A semiconductor device comprising:
   a transistor doping region of a vertical transistor structure arranged in a semiconductor substrate;
   a plurality of graphene layer portions, wherein each of the plurality of graphene layer portions is located adjacent to a respective portion of the transistor doping region at a surface of the semiconductor substrate; and
   a transistor wiring structure located adjacent to the plurality of graphene layer portions,
   wherein the transistor wiring structure is in contact with the transistor doping region between neighboring graphene layer portions of the plurality of graphene layer portions.

2. The semiconductor device according to claim 1, wherein the transistor doping region is a source doping region of the vertical transistor structure.

3. The semiconductor device according to claim 1, further comprising:
   a body doping region of the vertical transistor structure arranged adjacent to the transistor doping region in the semiconductor substrate,
   wherein an average doping concentration of the transistor doping region is greater than 80% of an average doping concentration of the body doping region and is less than 1000% of the average doping concentration of the body doping region of the vertical transistor structure.

4. The semiconductor device according to claim 3, wherein an average doping concentration of the transistor doping region is less than $5*10^{18}$ dopant atoms per $cm^3$.

5. The semiconductor device according to claim 1, wherein the plurality of graphene layer portions are portions of a graphene monolayer.

6. The semiconductor device according to claim 1, wherein the neighboring graphene layer portions of the plurality of graphene layer portions are located at a distance of at least 1 µm from one another.

7. The semiconductor device according to claim 1, wherein the transistor doping region is arranged in an epitaxial semiconductor layer of the semiconductor substrate.

8. The semiconductor device according to claim 1, wherein the semiconductor substrate is a silicon carbide based semiconductor substrate.

9. The semiconductor device according to claim 1, wherein the vertical transistor structure comprises a breakdown voltage of more than 10V.

10. A method for forming a semiconductor device, the method comprising:
    forming a transistor doping region of a vertical transistor structure in a semiconductor substrate;
    forming a plurality of graphene layer portions located adjacent to at least a portion of the transistor doping region at a surface of the semiconductor substrate, wherein each of the plurality of graphene layer portions is located adjacent to a respective portion of the transistor doping region at the surface of the semiconductor substrate; and
    forming a transistor wiring structure located adjacent to the plurality of graphene layer portions, wherein the transistor wiring structure is in contact with the transistor doping region between neighboring graphene layer portions of the plurality of graphene layer portions.

11. The method according to claim 10, wherein the semiconductor substrate is a silicon carbide based semiconductor substrate comprising the surface, and wherein the silicon carbide based semiconductor substrate is tempered to form the plurality of graphene layer portions at the surface of the silicon carbide based semiconductor substrate.

12. The method according to claim 11, wherein the plurality of graphene layer portions are formed before forming of a gate oxide of the vertical transistor structure.

13. The method according to claim 11, wherein the plurality of graphene layer portions are formed at a silicon terminated side of the silicon carbide based semiconductor substrate.

14. The method according to claim 11, further comprising:
    removing a portion of the plurality of graphene layer portions located laterally outside of the transistor doping region.

15. The method according to claim 10, further comprising:
    forming a carbonaceous metal layer at the surface of the semiconductor substrate; and
    segregating carbon atoms from the carbonaceous metal layer at an interface between the semiconductor substrate and the carbonaceous metal layer to form the plurality of graphene layer portions between the semiconductor substrate and the carbonaceous metal layer.

16. The method according to claim 15, further comprising:
    removing the carbonaceous metal layer from the plurality of graphene layer portions after segregating of the carbon atoms from the carbonaceous metal layer and before forming of the transistor wiring structure.

17. The method according to claim 15, wherein the plurality of graphene layer portions are formed after forming of a gate oxide of the vertical transistor structure.

18. A method for forming a semiconductor device, the method comprising:
- forming a transistor doping region of a vertical transistor structure in a semiconductor substrate;
- forming a graphene layer portion located adjacent to at least a portion of the transistor doping region at a surface of the semiconductor substrate;
- forming a transistor wiring structure located adjacent to the graphene layer portion;
- forming a carbonaceous metal layer at the surface of the semiconductor substrate; and
- segregating carbon atoms from the carbonaceous metal layer at an interface between the semiconductor substrate and the carbonaceous metal layer to form the graphene layer portion between the semiconductor substrate and the carbonaceous metal layer,
- wherein the carbonaceous metal layer forms at least a portion of the transistor wiring structure.

* * * * *